United States Patent
Mauck et al.

(12) 
(10) Patent No.: US 6,953,143 B2
(45) Date of Patent: Oct. 11, 2005

(54) EXPLOSION WELDED DESIGN FOR COOLING COMPONENTS

(75) Inventors: Justin Mauck, Fort Collins, CO (US); Steve Dillon, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 84 days.

(21) Appl. No.: 10/412,367

(22) Filed: Apr. 11, 2003

(65) Prior Publication Data

US 2004/0200419 A1 Oct. 14, 2004

(51) Int. Cl.$^7$ ............................................... B23K 31/00
(52) U.S. Cl. ..................... 228/107; 228/2.5; 228/159
(58) Field of Search ................... 228/107, 159–161, 228/2.5

(56) References Cited

U.S. PATENT DOCUMENTS

| | | | | |
|---|---|---|---|---|
| 3,657,466 A | * | 4/1972 | Woolcock et al. | 174/15.4 |
| 3,732,031 A | * | 5/1973 | Bowling et al. | 416/97 R |
| 3,911,567 A | * | 10/1975 | Hofer | 29/872 |
| 5,230,459 A | * | 7/1993 | Mueller et al. | 228/164 |
| 5,565,071 A | * | 10/1996 | Demaray et al. | 204/192.12 |
| 5,676,803 A | * | 10/1997 | Demaray et al. | 204/192.12 |
| 6,147,334 A | * | 11/2000 | Hannigan | 219/544 |
| 6,415,811 B1 | * | 7/2002 | Irnich et al. | 137/340 |
| 6,708,870 B2 | * | 3/2004 | Koenigsmann et al. | 228/210 |
| 2003/0218054 A1 | * | 11/2003 | Koenigsmann et al. | 228/115 |
| 2004/0200419 A1 | * | 10/2004 | Mauck et al. | 118/724 |

FOREIGN PATENT DOCUMENTS

| | | | |
|---|---|---|---|
| DE | 004035893 C1 | * | 1/1992 |
| DE | 004035896 C1 | * | 1/1992 |
| DE | 004114669 A1 | * | 11/1992 |
| GB | 002119582 A | * | 11/1983 |

* cited by examiner

*Primary Examiner*—Kiley S. Stoner
(74) *Attorney, Agent, or Firm*—Blakely, Sokoloff, Taylor & Zafman LLP (57) ABSTRACT

A method and apparatus are described for making a coldplate. A first component of, for example copper, is explosion welded to a second component of, for example aluminum. The first metal component has a top surface opposite the second metal component and at least one channel proximate the top surface adapted to carry a cooling fluid. The coldplate can be used as an interior wall for a plasma chamber.

19 Claims, 7 Drawing Sheets

EXPLOSION WELDED DESIGN FOR COOLING COMPONENTS

BACKGROUND

1. Field

Embodiments of this invention relate to the field of coldplate and vacuum chamber cooling designs, and more specifically, to a coldplate or chamber wall formed of two materials joined together using explosion welding.

2. Description of the Related Art

Vacuum chambers sometimes generate a large amount of heat due to processes occurring inside (e.g. plasma generation), and the heat must be removed to protect components of the chamber. For large heat loads, a fluid is used to cool the chamber. Ideally, the cooling fluid should flow through channels made directly on the body of the vacuum chamber. However, as this method is generally impractical, heat is usually removed by attaching cooling tubes to the chamber and flowing cooling fluid through the tubes.

This method works for low heat flux densities because the high thermal resistance from chamber to cooling fluid is not so great as to result in overly high chamber temperatures. As vacuum chambers are made smaller, greater heat flux densities make the chamber hotter. This demands a more efficient method of removing heat in order to keep the chamber temperatures at acceptable levels. Coldplates are similarly used in many different applications to cool electronics and other components. For example, in plasma chambers, coldplates are used for the walls of the plasma chamber and also to provide cooling to electronic components. Typically, coldplates are also made by attaching cooling tubes to a metal part, such as a machined aluminum or aluminum alloy plate and then attaching the plate on a substrate that carries components to be cooled. As with the chamber cooling pipes, one limitation of this approach is the attachment between the cooling tubes and the metal plate. If the tubes are soldered, brazed, welded or epoxied to the aluminum plate, then the attachment point might limit the flow of heat from the plate to the cooling tubes.

SUMMARY OF THE INVENTION

A method and apparatus are described for making a coldplate. A first component of, for example copper, is explosion welded to a second component of, for example aluminum. The first metal component has a top surface opposite the second metal component and at least one channel proximate the top surface adapted to carry a cooling fluid. The coldplate can be used as an interior wall for a plasma chamber.

BRIEF DESCRIPTION OF THE DRAWINGS

Embodiments of the present invention are illustrated by way of example, an not by way of limitation, in the figures of the accompanying drawings in which like reference numerals refer to similar elements and in which.

DETAILED DESCRIPTION OF THE INVENTION

1. Overview

An effective design for cooling vacuum chambers is described below. The design described herein is more efficient at removing heat due to the low thermal resistance interface that explosion welding provides between the materials of the chamber or coldplate and the materials of the cooling channels. The materials are explosion welded together, then cooling channels or grooves are made. This can be done by forming a groove in the top surface of the first metal component (i.e., copper), and then sealing the groove by brazing a second metal component (i.e. copper) onto the first metal component. Alternatively the channels can be formed by drilling a tunnel into the side of the first metal component and then manifolding the channels together. Many other approaches can be applied to form the cooling channels.

Explosion welding is a solid state welding process in which a controlled detonation is used to join or to combine two metallic parts, creating an atomic bond in the metal interface or even an alloy of the two metals. Even though heat is not applied in making an explosion weld, the metal at the interface can be molten during welding. The result is a very strong bond line between the two materials.

2. Introduction

Figure 1:
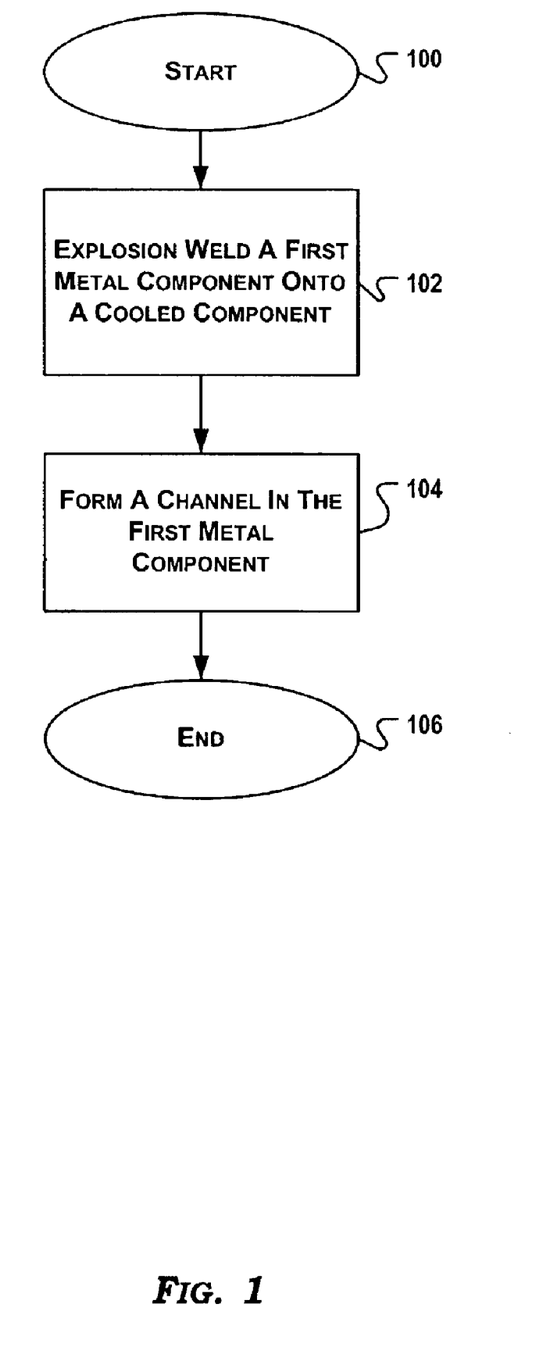
FIG. 1 is a flowchart illustrating a method for cooling a vacuum chamber using explosion welding in accordance with general embodiments of the invention.

FIG. 1 is a flowchart illustrating a method for making components of a vacuum chamber using explosion welding. The method begins at block 100 and continues to block 102 where a first metal component is explosion welded onto a second component. The first metal component will carry the cooling fluid that will conduct heat away from the structure. The second metal component can be a coldplate, a vacuum chamber wall or any other component that requires cooling. At least one channel for carrying a cooling fluid is then formed in the first metal component at block 104. The method ends at block 106. Additional, machining, milling, fastening, and shaping steps may also be performed to obtain a desired structure. Other components may be attached or coupled to the structure. These steps are not shown in FIG. 1, so as not to obscure the details of the invention.

Figure 2:
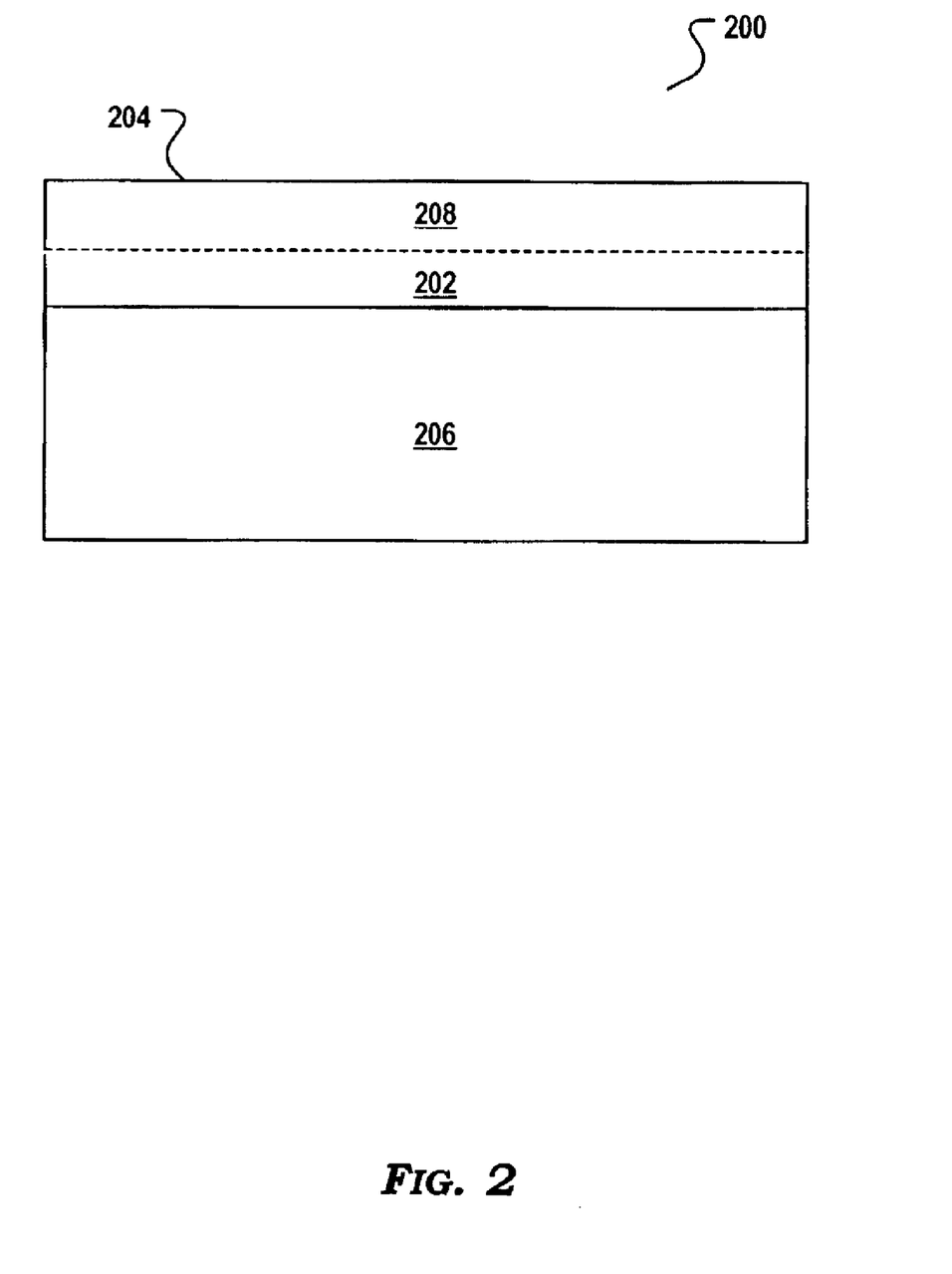
FIG. 2 is a cross-sectional diagram of components of a vacuum chamber made by explosion welding in accordance with general embodiments of the invention.
Figure 3:
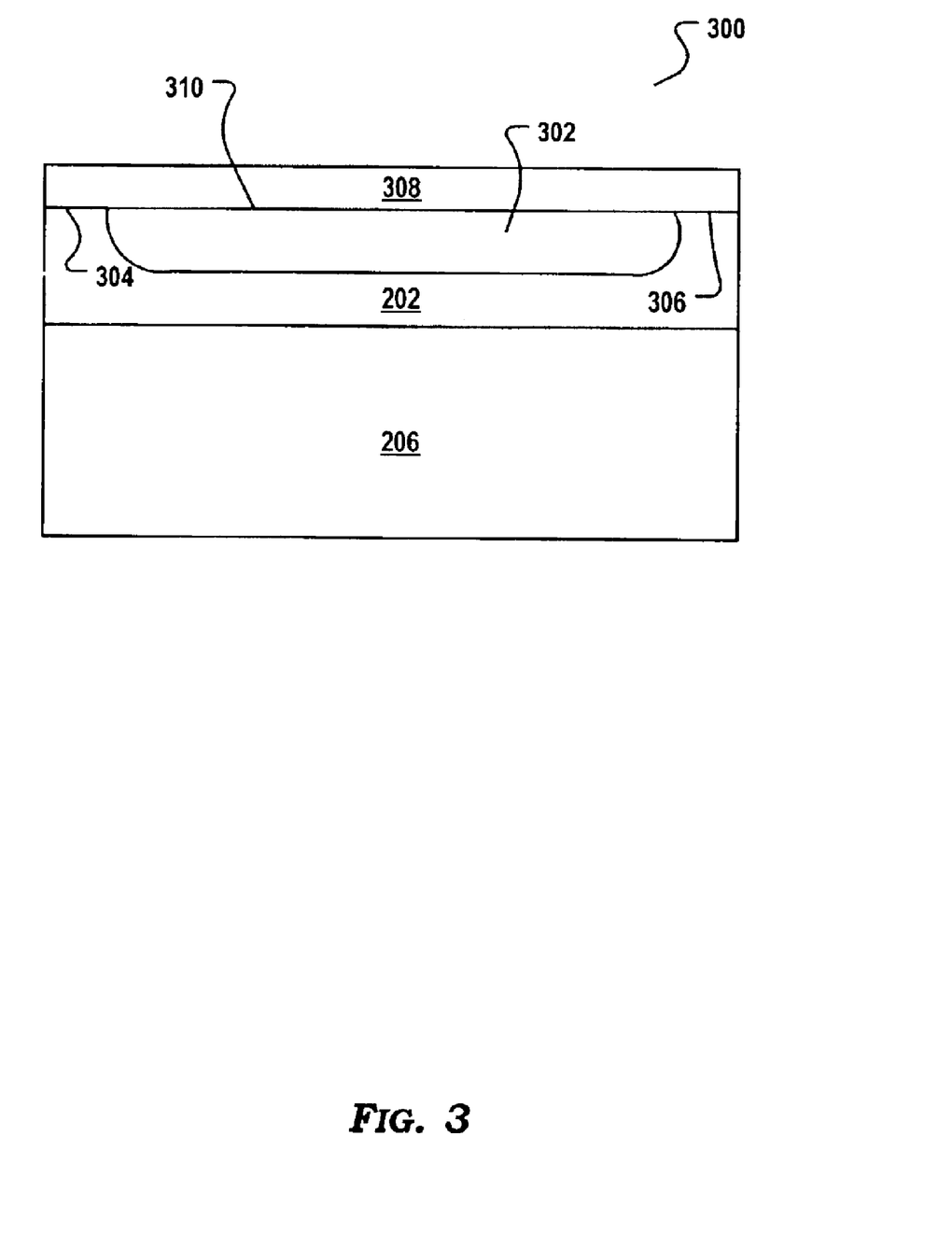
FIG. 3 is a cross-sectional diagram of components of a vacuum chamber made by explosion welding in accordance with a first embodiment of the invention.

FIG. 2 illustrates components in a vacuum chamber made by explosion welding in accordance with general embodiments of the invention. The chamber 200 comprises a first metal component 202 that is explosion welded onto a second cooled component 206. The first metal component 202 has a top surface 204, as well as a channel 208 through which a cooling fluid flows. This structure can be one of many parts in a vacuum chamber wall or it can be coupled to a heat producing component or area. FIG. 3 illustrates components of a vacuum chamber made by explosion welding in accordance with a first embodiment of the invention. The chamber 300 comprises a first metal component 202 explosion welded onto a second, cooled component 206. A groove 302 is formed in the top surface 304 of the first metal component 202, between a first upper surface 404 of the top surface 204, and a second upper surface 406 of the top surface 204. The groove can be formed in many different ways including machining, drilling and etching. In addition, the particular shape of the groove will depend upon the particular application, including the nature of the cooling fluid, the flow rates desired and the surface heat transfer needed.

A third metal component 308 is brazed onto the top surface 300 of the first metal component 202 at the first 304 and second upper surfaces 306, where the second metal component 308 has an inner surface 310 that faces the groove 302. The third metal component can be made of any material including the same material as the first component, to reduce corrosion. Alternatively, an inert or amorphous material such as glass, ceramic, or plastics can be used. While brazing is suggested, any of a variety of different techniques can be used to attach the two pieces together. Brazing works well when both components are copper, but other materials may work better using other attachment techniques.

In this embodiment, channel 208 forms a groove 302 that is open at the top, and then sealed off when the third metal component 308 is brazed onto the upper surfaces 304, 306. The groove can be sealed off in any of a variety of different ways. The brazed cover plate is provided only as an example. Alternatively, the cooling fluid channel can be drilled or extruded into the piece so that no cover plate is required.

Figure 4:
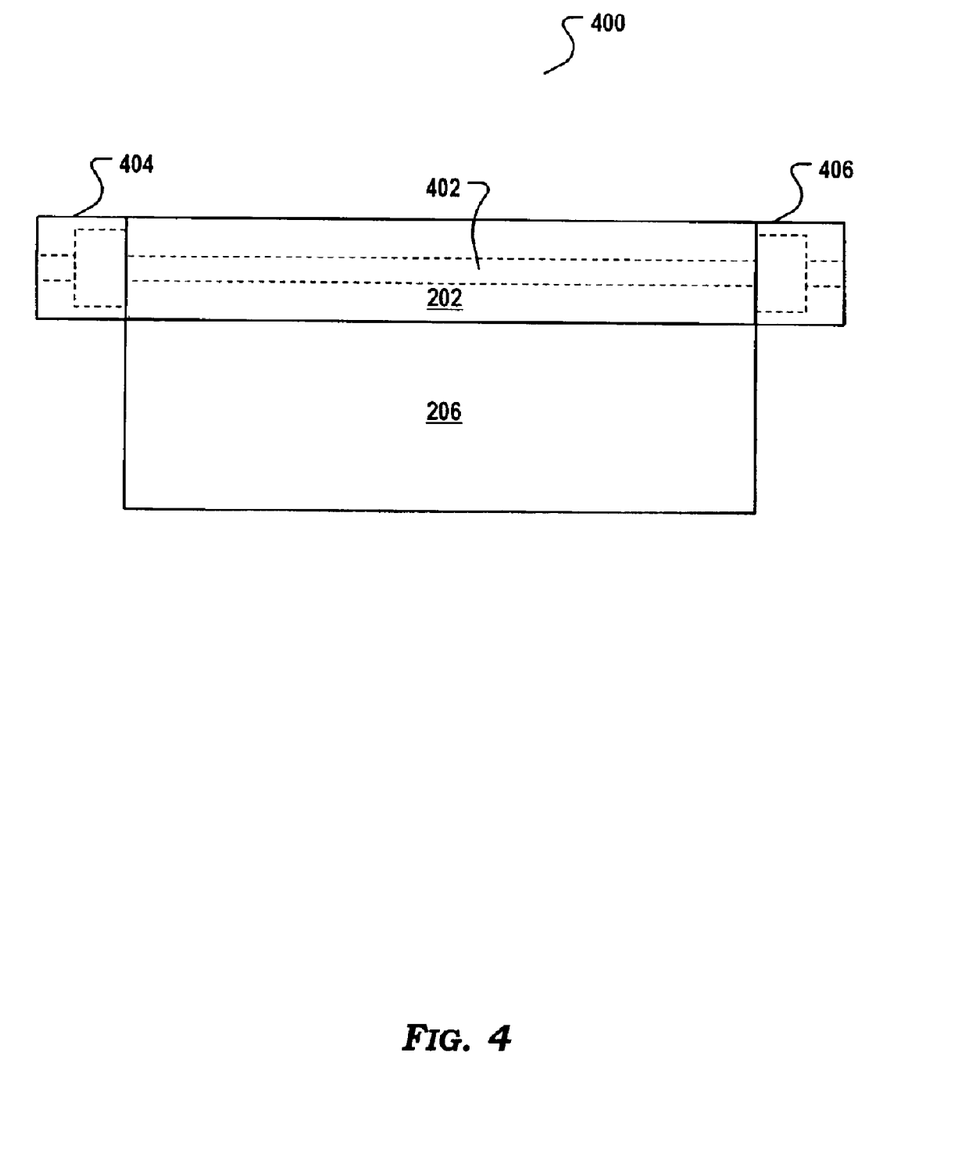
FIG. 4 is a cross-sectional diagram of components of a vacuum chamber made by explosion welding in accordance with a second embodiment of the invention.

FIG. 4 illustrates components in a vacuum chamber made by explosion welding in accordance with a second embodiment of the invention. The chamber 400 comprises a first metal component 202 explosion welded onto the second cooled component 206; and a tunnel 402 formed inside of the first metal component 202. The tunnel is shaped to carry the cooling fluid. The vacuum chamber in the second embodiment also has copper end plates 404, 406 on either end of the tunnel to manifold and seal the ends of the tunnel 402. In this embodiment, the tunnel 402 is closed off at the top, and open at the ends, and the channel 208 is sealed off at the ends when the end plates 404, 406 are attached.

Figure 5:
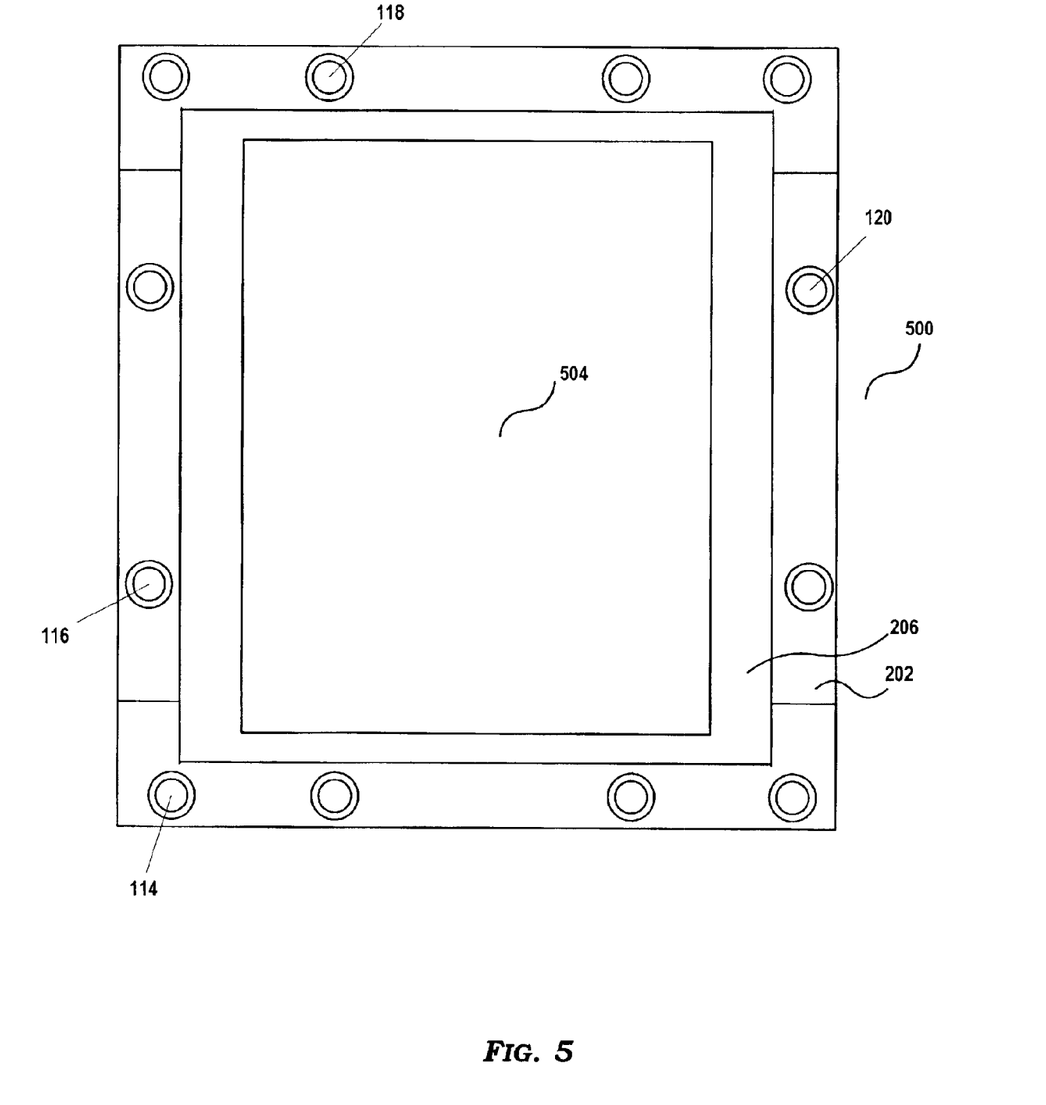
FIG. 5 is a cross-sectional diagram of a vacuum chamber using general embodiments of the invention as side walls of the chamber.

In another embodiment, the bottom surface of the second, cooled component is placed over a top surface of a vacuum chamber 500, such that one side of the vacuum chamber comprises the bottom surface of the cooled component 206, as illustrated in FIG. 5. The vacuum chamber 500 has a cast coldplate formed from a surface of a cooled component 206 on several sides of the vacuum chamber made of a material such as aluminum or aluminum alloy to form the chamber 504 in which plasma is maintained. As plasma moves through the vacuum chamber 504, the plasma and cast coldplate 206 increase in temperature. To keep the vacuum chamber 504 cool, water is run through cooling channels 114, 116, 118, 120 formed in the first component 202. The cooling channels can have any of the forms shown above or be drilled out of the first component as shown in FIG. 4.

Figure 6:
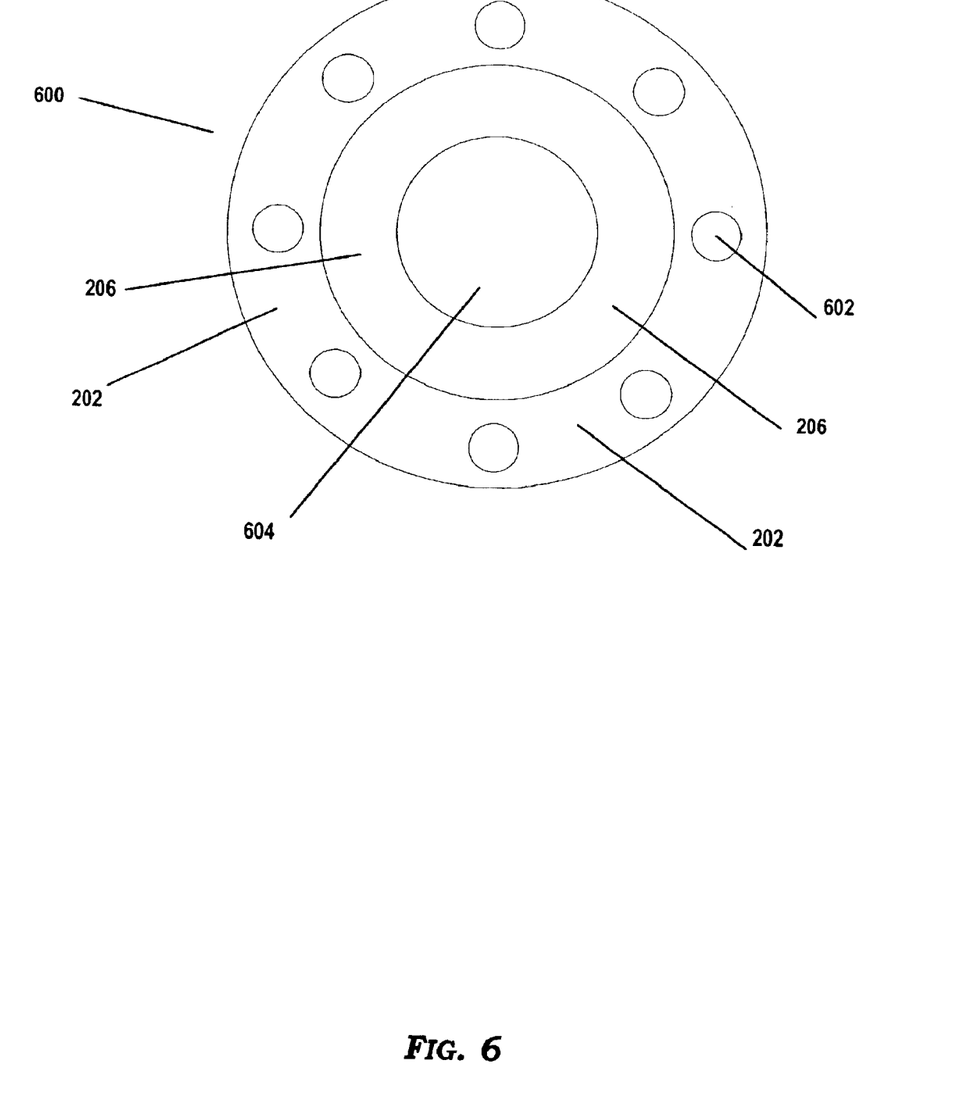
FIG. 6 is a cross-sectional diagram of a tubular vacuum chamber using general embodiments of the invention as side walls of the chamber.

FIG. 6 illustrates a tubular or cylindrical vacuum chamber in cross section made by explosion welding in accordance with a third embodiment of the invention. The product of the explosion welding can be roughly cylindrical or spherical. In one embodiment, an extruded rod of the second metal component is placed inside an extruded tube of the first metal component. The two pieces are explosion welded together from the exterior of the tube. Alternatively, the second metal component can be in the shape of a tube with a central cavity. After the explosion welding, the inner cavity can be shaped by e.g. drilling to ensure that the desired interior cavity shape is obtained.

As shown in cross-section in FIG. 6, after some shaping, milling or forming. The resulting chamber 600 comprises the first metal component 202 explosion welded onto the second cooled component 206; and a drilled channel 602 formed inside of the first metal component 202. The channel is shaped to carry the cooling fluid. As shown in some of the other embodiments end plates (not shown) can be applied to either end of the tunnel to manifold and seal the ends of the channels 602. Alternatively, instead of drilled channels, tunnels as shown in FIG. 4 can be used. Inside the cooled component 206, a central cavity 604 has been formed by drilling, milling, machining, etching or in some other way. This central cavity can be used to contain the plasma to form a plasma chamber. Appropriate ports (not shown) can be added to insert, remove and manipulate the plasma material.

3. First and Third Metal Components

The first and third metal components can be constructed of any metal that has the properties desired for the intended application. For a vacuum chamber for containing a plasma, such metals include almost any metal that is not prone to corrosion by the cooling fluids, such as stainless steel, or copper. For example, with a Hydrogen or Fluorine plasma chamber for semiconductor processing, aluminum is typically used as the plasma chamber interior wall, the second, cooled material component, With aluminum, copper is can be used for the first and third metal components, since copper is less likely to degrade by galvanic corrosion. Also, copper has a high thermal conductivity compared to other metals, resulting in less thermal resistance from the metal component to the cooling fluid.

The first metal component may be about 1" in thickness, and the third metal component up to 6" in thickness. However, the best size and thickness will depend on the particular application. Also, although the metal components shown as examples in the figures are flat and rectangular, the method can be applied to other geometrical shapes such as toroids and cylinders.

4. Cooling Material Component

The cooled component can be made from any material that is appropriate for the intended application. For coldplates, aluminum and copper can be used among others. For vacuum chamber wall, the metal should be compatible with the vacuum chamber process. Such metals include stainless steel and aluminum (because it can be anodized) which provide corrosion resistance against different types of environments. In a vacuum chamber design, this component is, for example, approximately 4" thick to accommodate machining the chamber body. Again, and the particular dimensions will depend on the application. As noted for the case of the metal components, although the cooled components shown in the figures are flat and rectangular, the present invention can be applied to other geometrical shapes.

5. Channel

Figure 7:
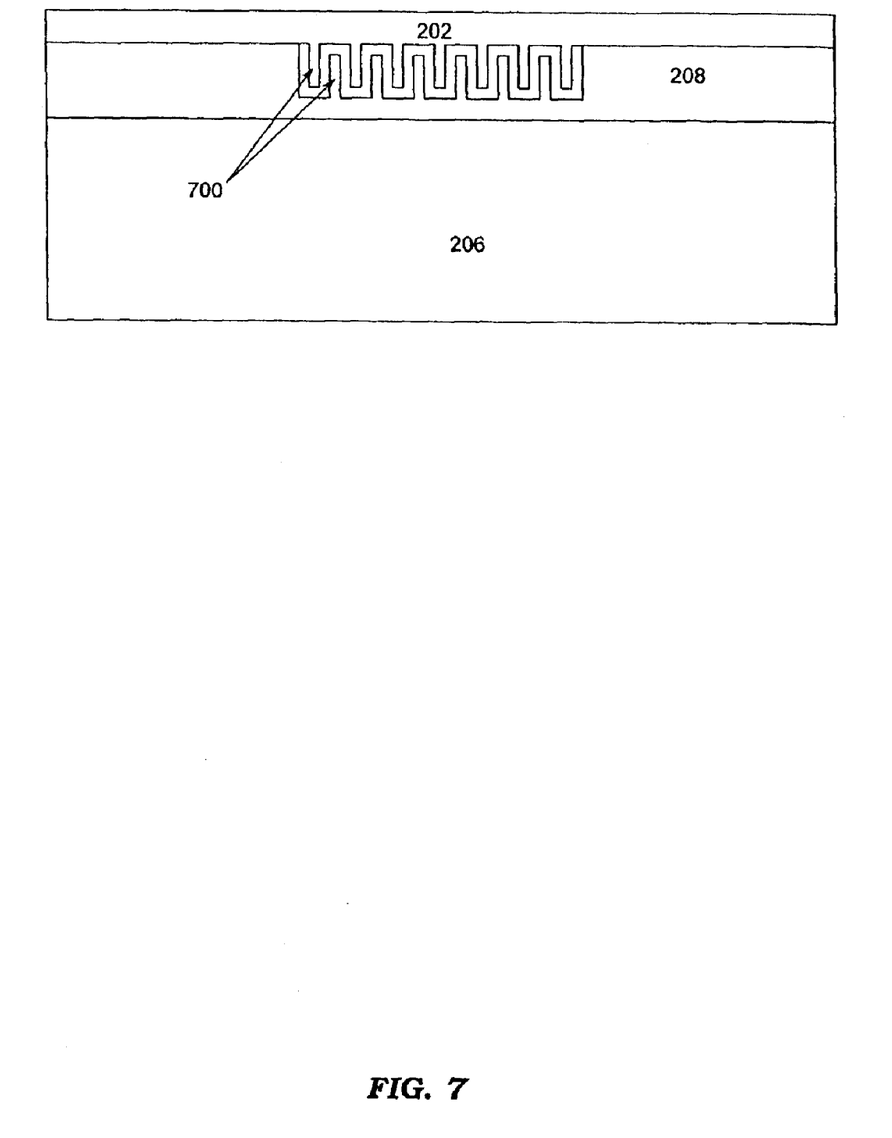
FIG. 7 is a cross-sectional diagram of fins on a metal component to improve thermal performance.

The channel allows a cooling fluid, such as water, or other heat transfer coolants, to flow through. As illustrated in FIG. 7, features, such as fins 700, may be machined into the channel 208 to increase the surface area in the channel 208, which, in turn, enhances the thermal performance. This is done prior to brazing the second metal component to the first. As shown in FIG. 7, both the first and third metal components have features, such as fins, machined onto them to improve cooling. The fins are shown as a cross-sectional view and accordingly appear as teeth in the drawing.

6. General Matters

In the description above, for the purposes of explanation, numerous specific details are set forth in order to provide a thorough understanding of the present invention. It will be apparent, however, to one skilled in the art that the present invention may be practiced without some of these specific details. In other instances, well-known circuits, structures, devices, and techniques have been shown in block diagram form or without detail in order not to obscure the understanding of this description.

The present invention includes various steps, but steps can be added to or deleted from any of the methods and signal or messages can be added or subtracted from any of the described steps or control lines without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

Furthermore, while the invention has been illustrated in the context of a coldplate or a plasma chamber wall, the invention is not so limited. It can be applied to coldplates in general, as well as to any application in which a component needs cooling and in which an increased amount of thermal flux between two different components is desired.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. A method of making a coldplate comprising:
   explosion welding a first component to a second component, the first component having a top surface opposite the second component; and
   creating at least one channel in the first component proximate the top surface and spaced apart from the second component, the channel being adapted to carry a cooling fluid; and
   applying the second component as a surface of a vacuum chamber, wherein a surface of the second component opposite the first component is adjacent to the interior of the vacuum chamber.

2. The method of claim 1, wherein creating at least one channel comprises, for one channel:
   forming a groove in the top surface of the first component, the groove being located between a first upper surface of the top surface, and a second upper surface of the top surface; and
   attaching a third component onto the first component at the first and second upper surfaces to seal the groove.

3. The method of claim 2, wherein forming the groove comprises forming at least one fin within the groove to increase heat conduction between the first component and the cooling fluid.

4. The method of claim 1, wherein forming at least one channel comprises, for one channel, forming a tunnel inside the first component.

5. The method of claim 4, additionally comprising adding end plates to each end of the tunnel to manifold and seal the ends of the tunnel.

6. The method of claim 1, wherein the first component and the second component are metal.

7. The method of claim 6, wherein the vacuum chamber and the second component are made of a same material.

8. The method of claim 6, wherein the second component comprises an aluminum alloy.

9. The method of claim 8, wherein first component comprises copper.

10. The method of claim 1, wherein the coldplate is attached to each side of a vacuum chamber.

11. A method of making a coldplate comprising:
    explosion welding a first metal component made of a material to a second metal component made of the same material, the first component having a top surface opposite the second component;
    creating at least one channel in the first component proximate the top surface, the channel being adapted to carry a cooling fluid; and
    applying the second component as a surface of a vacuum chamber, wherein a surface of the second component opposite the first component is adjacent to the interior of the vacuum chamber.

12. The method of claim 11, wherein creating at least one channel comprises, for one channel:
    forming a groove in the top surface of the first component, the groove being located between a first upper surface of the top surface, and a second upper surface of the top surface; and
    attaching a third component onto the first component at the first and second upper surfaces to seal the groove.

13. The method of claim 12, wherein forming the groove comprises forming at least one fin within the groove to increase heat conduction between the first component and the cooling fluid.

14. The method of claim 11, wherein forming at least one channel comprises, for one channel, forming a tunnel inside the first component.

15. The method of claim 14, additionally comprising adding end plates to each end of the tunnel to manifold and seal the ends of the tunnel.

16. The method of claim 1, wherein the first component and the second component comprise metals.

17. The method of claim 16, wherein the second component comprises an aluminum alloy.

18. The method of claim 17, wherein first component comprises copper.

19. The method of claim 11, wherein the coldplate is attached to each side of a vacuum chamber.

* * * * *